March 15, 1966 J. H. EDDLESTON 3,241,010
SEMICONDUCTOR JUNCTION PASSIVATION
Filed March 23, 1962
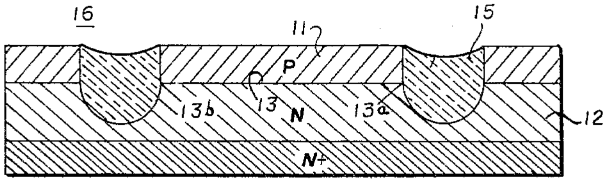
Fig. 1
Fig. 4
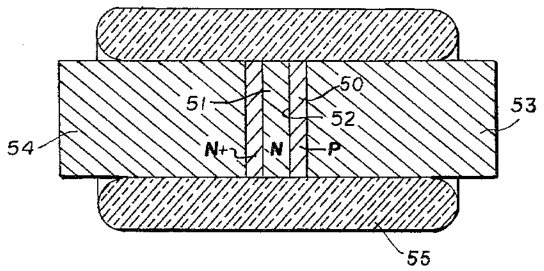
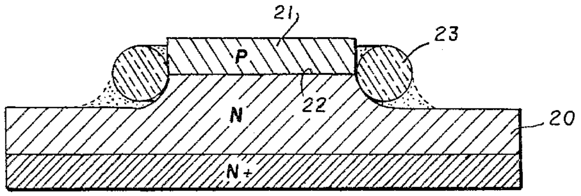
Fig. 2
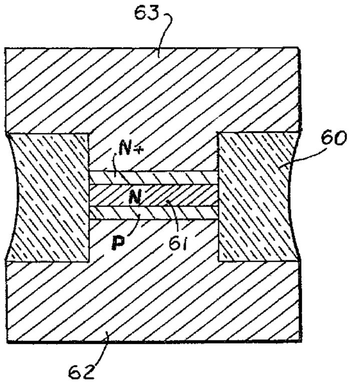
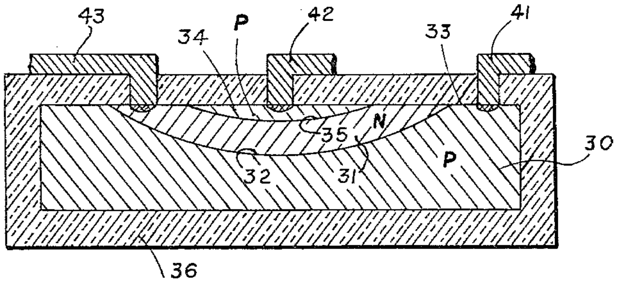
Fig. 5
Fig. 3
JAMES H. EDDLESTON
INVENTOR.
BY D. Carl Richards
ATTORNEY United States Patent Office 3,241,010
Patented Mar. 15, 1966

3,241,010
SEMICONDUCTOR JUNCTION PASSIVATION

James H. Eddleston, Camarillo, Calif., assignor to Texas Instruments Incorporated, Dallas, Tex., a corporation of Delaware Filed Mar. 23, 1962, Ser. No. 181,857
3 Claims. (Cl. 317—234)

This invention relates to semiconductor devices and more particularly to passivation of surface exposed junction areas.

Semiconductor devices have been found to be subject to deterioration and contamination at the sites of P–N junctions, particularly in the zones where the junctions are at the surface of a given structure. It is thought that the atoms forming the surface layer may have free bonds which readily attach themselves to contaminant material. Contaminants may, to a degree, bridge the junction, thus degrading the device particualrly for high temperature operation and under high back voltages. It has heretofore been proposed that a surface layer of an oxide of the semiconductor material be formed over the entire surface of a given semiconductor device with suitable terminal connections being completed through the oxide layer to the material thereunder. However, the oxide layer is not completely impermeable and such devices have been found to fall short of the desired objective, namely, of providing a semiconductor device which is reliable in that it is provided with a true hermetic seal and will operate under excessively severe conditions over long periods.

In accordance with the present invention, there have been provided semiconductor devices having passivated junction areas. Further devices have been provided which are completely hermetically sealed by the material preforming the passivation function.

More particularly, in accordance with the present invention, there is provided a semiconductor device having a first region of one conductivity type. A second region of different conductivity type adjacent to the first region is formed with a junction between them extending to surface areas of the device. A coating adherent to the surface areas is provided which overlies the junction to passivate the same, the coating being formed of a glass of a major portion of lead oxide and silicon dioxide and a minor portion of aluminum oxide.

In a specific embodiment of the invention a passivating glass compound was formed of 50% lead oxide, 40% silicon dioxide, and 10% aluminum oxide, all of high purity. This glass was satisfactory for use on silicon semiconductor devices, fused to the surface of the semiconductor device as to cover all areas of junction exposure.

For a more complete understanding of the present invention and for further objects and advantages thereof, reference may now be had to the following description taken in conjunction with the accompanying drawings in which:

FIGURE 1 illustrates in cross-section a diode with a moat type seal;

FIGURE 2 illustrates in cross-section a mesa diode with a ring seal;

FIGURE 3 illustrates in cross-section a planar hermetically sealed transistor;

FIGURE 4 illustrates in cross-section a seal and package combination for a diode; and FIGURE 5 illustrates in cross-section a further form of encapsulation where passivating material forms a support.

Referring now to FIGURE 1, there is illustrated a semiconductor device 16 having a P-layer 11 and an N-layer 12 with a junction 13 therebetween. A moat or ring-like depression etched in the upper surface of the unit 16 extends through the junction 13 and into the N material 12. The junction 13 is thus exposed in the etched zone as well as at the ends of the device 16. The device 16 is a diode with potentials being applied to the P–N regions with a rectifying junction 13 therebetween. The junction 13 serves as a barrier for back voltages, it being desirable to minimize leakage. However, it has been found that under ambient conditions the areas at zones 13_a_ and 13_b_ marking emergence of the junction 13 at the surface are susceptible to contamination. Attempts have been undertaken to eliminate the tendency for contamination by various means. However, there has not heretofore been available a suitable passivation technique or passivating material. In accordance with the present invention, however, the passivation is accomplished by adhering a suitable material directly to the surface of the semiconductor device in the areas in which the junction emerges at the surface which will not contaminate the junction and which will provide a seal therefor. More particularly, in accordance with one aspect of the present invention, the moat, formed around the central portion of the device 16, is filled with a suitable glass composition which is fused to the exposed surfaces. The glass composition thus forms a ring-like body 15 which completely fills the moat.

In a preferred embodiment of the invention, the glass for use on a silicon device had the following composition:

| | Percent |
|---|---|
| Lead oxide | 50 |
| Silicon dioxide | 40 |
| Aluminum oxide | 10 |

The constituents of the glass were maintained substantially free of any trace elements that are not neutral in the semiconductor device.

A lead oxide was employed with low level impurities, being of the order of 99.9999% pure lead oxide. Similarly, silicon dioxide and aluminum oxide of as high purity as available were employed.

The proportions in the major components of the glass formed of the foregoing composition, though of importance, are not as critical as the trace element constituents therein. For semiconductor devices of Group IV doped with elements of Group III or Group V, trace elements in Group III and Group V preferably are to be eliminated or must be minimized. Therefore, substantially pure components are employed.

In carrying out the invention illustrated in FIGURE 1, a glass frit was suspended in distilled water and placed on a clean silicon wafer to form a plurality of units such as the diode 16. Rings 15 were etched therein approximately 3 mils deep forming moats in which the glass suspension was retained. The glass was then fused at approximately 1000° C. in a helium atmosphere. The wafer was then lapped to remove the glass from the contact areas within the perimeters of the moats. The surface was then cleaned and re-fused. The wafer was then nickel plated and cut to desired size. Individual devices formed from the wafer were then soldered into packaging components with suitable leads thereon.

In operation of diodes thus formed, the reverse leakage current was less than 0.7 micro-ampere at −500 volts. The forward current was greater than 1 ampere at 1 volt. The glass fused to the surface area from which the junction 13 emerged served as to passivate the junction. Extended life under severe operating conditions characterized the units.

FIGURE 2 illustrates a modified form of a passivated device. In this device a mesa type diode is formed from a silicon slab having an N-region 20 and a P-region 21.

The wafer is etched selectively to leave the mesa standing above the N-region with the junction 22 therebetween extending to the surface on the slopes of the mesa. The junction is passivated by placing a glass ring 23 over the mesa to contact the slopes of the mesa in the region of the emergence of the junction. The glass when heated to be fused to the surface of the mesa seals the junction zones.

FIGURE 3 illustrates a further modification in which a planar device having doubly diffused regions is passivated and hermetically sealed. More particularly, a P-region 30 forms the collector of a transistor having a base region 31 with a base collector junction 32 being cup-shaped and extending to the upper surface 33. The N-region 31 overlies the P-region 30 and, in turn, is overlain by a P-region 34. Junction 35 extends to the upper surface 33. In this planar device two critical zones are present, i.e., the areas in which the junction 32 and junction 35 emerge at the upper surface 33. A glass sealing and passivating coating 36 is fused to the surface of the device completely encapsulating the device. There is thus formed a hermetic seal as well as a passivating coating for the junction areas.

In this embodiment terminals 41, 42 and 43 contact the zones 30, 31 and 34, respectively, extending through windows etched in the glass coating 36. Contacts 41–43 provide for completion of electrical connections to the zones of the transistor.

FIGURE 4 illustrates encapsulation of a diode having P-zone 50 and an N-zone 51 with a junction 52 therebetween. The device is in the form of a circular disk or wafer having metal contacts 53 and 54, respectively, engaging in abutting relation the surfaces of the P-layer 50 and the N-layer 51, respectively. The entire structure is inserted within a short section of glass tube 55, preferably a tube drawn from glass having the properties above described. The tube 55 may be formed of the materials above described in a form in which the glass frit with a binder is molded into a tube. In either case, the elements and the glass tube 55 are then heated to fusing temperature whereupon the junction 52 is passivated by fusing of the glass ring 55 at the junction area as well as to the contacts 53 and 54.

FIGURE 5 illustrates a further modification. A glass tube 60 is employed to encapsulate and support a wafer 61 as well as end terminals 62 and 63. The junction region at the surface of the device 61 is thus passivated by the fusion thereto of the glass 60.

As mentioned above, it is sometimes desirable completely to coat a given semiconductor device with an oxide layer for one purpose or another. However, even where an oxide coating is provided, passivation in accordance with the present invention is still desirable. Thus, the passivating coating above described may be formed directly onto the silicon itself or onto an oxide layer formed over the surface. In either event passivation as well as hermetic sealing is possible. For the purpose of this description reference to a coating adherent directly to surface areas at which the junction emerges shall be taken to mean coating applied both with and without an oxide layer.

The foregoing description has related primarily to passivation of silicon devices. For germanium devices glass of the same constituents would be employed, but preferably in the following proportions:

| | Percent |
|---|---|
| Lead oxide | 60 |
| Silicon dioxide | 30 |
| Aluminum oxide | 10 |

The glass is one in which contaminant trace elements are substantially eliminated but which has bulk characteristics such as a thermal coefficient of expansion corresponding with that of the semiconductor device.

The major constitutents of the glass are lead oxide and silicon dioxide. The relative proportions of the major constituents may be varied to form a coating having the same bulk characteristics as the device to be passivated. The minor constitutent, aluminum oxide, has been held constant in the examples given but may be subject to variation.

Tolerable levels of non-neutral trace elements are difficult to specify since measurement of trace concentrations involved are difficult if not impossible. Since the devices themselves possess characteristics which are controlled by trace quantity doping levels, the doping constituents in the passivating coating must be far below the level of doping in the device itself. In order to provide a usable passivating coating, materials of as high purity as obtainable have been employed. More particularly, where available the three constituents of the glass each have been 99.9999% free from any other constituent.

It is to be understood that impurities of relatively high concentration may be tolerated only if they are neutral. Silicon and germanium devices are doped with non-neutral elements from Groups III and V for producing P- and N-regions, respectively. Devices made from gallium arsenide and from other Group III and Group V compound semiconductors are doped with non-neutral elements from Groups II and IV for producing P-regions and with elements from Groups IV and VI for producing N-regions. In any case, the passivating composition is maintained free of the doping elements.

By way of example, a glass found to be suitable was made from lead oxide marketed by Hammond Lead Products of Hammond, Indiana, and known as "Letharge." The silicon dioxide was glass sand known in the art as "Supersil" and available from Pennsylvania Glass Sand Corporation of Pittsburgh, Pennsylvania. Aluminum oxide sold by Alcoa under the designation of A–14 has been employed. Based upon performance tests, Alcoa A–14 aluminum oxide has been found to be superior to other aluminum oxide compositions purportedly of like purity but from different sources and suppliers. This has been found even though no measurable differences could be found between the preferred composition and those of less desirable performance.

In accordance with the invention a semiconductor device is passivated by cleaning the areas of emergence of a junction at the surface and supporting adjacent to said areas a glass composition which is of constituents substantially limited to lead oxide, silicon dioxide, aluminum oxide and trace elements neutral to said device. The device and glass are heated to fuse the glass to the device completely to cover the areas of emergence as above illustrated and described. Two-layer devices such as diodes, three-layer transistors, and P–N–P–N devices such as four-layer diodes all have in common the problem of contamination of the surface-exposed junction zones which in accordance with the present invention may be passivated.

Having described the invention in connection with certain specific embodiments thereof, it is to be understood that further modifications may now suggest themselves to those skilled in the art, and it is intended to cover such modifications as fall within the scope of the appended claims.

What is claimed is:

1. A semiconductor device comprising:
(a) a first region of one conductivity type semiconductor material,
(b) a second region of a different conductivity type semiconductor material adjacent to said first region with a junction therebetwen extending to surface areas of said device, and
(c) a coating adherent to said surface areas in intimate contact with said junction to passivate said junction, said coating being formed of a glass of major portion of lead oxide and a major portion of silicon dioxide and about 10% of aluminum oxide and only trace elements neutral with respect to the semiconductor material.

2. A semiconductor device comprising:
(a) a first region of one conductivity type,
(b) a second region of a different conductivity type adjacent to said first region with a junction therebetween extending to surface areas of said device, and
(c) a coating adherent to said surface areas in intimate contact with said junction to passivate said junction, said coating being formed of a glass comprising 50% to 60% lead oxide, 30% to 40% silicon dioxide, 10% aluminum oxide and only trace neutral elements.

3. A semiconductor device comprising:
(a) a first region of one conductivity type semiconductor material,
(b) a second region of a different conductivity type semiconductor material, adjacent to said first region with a junction therebetween extending to surface areas of said device,
(c) a glass coating overlying said junction to passivate said junction, said glass coating being of a major portion of lead oxide, a major portion of silicon dioxide and about 10% aluminum oxide, and only trace elements neutral with respect to the semiconductor material, and
(d) an electrical terminal contacting each of said regions.

References Cited by the Examiner

UNITED STATES PATENTS

| | | | |
|---|---|---|---|
| 2,694,168 | 11/1954 | North et al. | 317—235 X |
| 2,998,558 | 8/1961 | Maiden et al. | 317—234 |

FOREIGN PATENTS

| | | |
|---|---|---|
| 571,756 | 3/1959 | Canada. |

OTHER REFERENCES

Dalton; "Solder Glass Sealing," Journal of The American Ceramic Society, vol. 39, No. 3, March 1956, pages 109 to 112.

JOHN W. HUCKERT, *Primary Examiner.*

JAMES D. KALLAM, DAVID J. GALVIN, *Examiners.*